United States Patent
Matsuyama et al.

(10) Patent No.: US 6,812,581 B2
(45) Date of Patent: Nov. 2, 2004

(54) CHIP SIZE PACKAGE WITH STRESS RELIEVING INTERNAL TERMINAL

(75) Inventors: Hisashi Matsuyama, Ogaki (JP); Mitsuru Okigawa, Nagoya (JP)

(73) Assignee: Sanyo Electric Co., Ltd., Osaka (JP)

( * ) Notice: Subject to any disclaimer, the term of this patent is extended or adjusted under 35 U.S.C. 154(b) by 25 days.

(21) Appl. No.: 10/442,685

(22) Filed: May 20, 2003

(65) Prior Publication Data

US 2004/0012095 A1 Jan. 22, 2004

(30) Foreign Application Priority Data

May 22, 2002 (JP) .................................. 2002-148049

(51) Int. Cl.⁷ .............................................. H01L 23/29
(52) U.S. Cl. ...................... 257/793; 257/784; 257/690
(58) Field of Search ................................. 257/225, 239, 257/240, 241, 246, 687, 690, 784, 793; 377/57–63

Primary Examiner—Eddie Lee
Assistant Examiner—Douglas W. Owens
(74) Attorney, Agent, or Firm—Sheridan Ross PC

(57) ABSTRACT

A semiconductor integrated device that resists breakage of an internal wire. An epoxy resin covers a lower surface and side surface of a semiconductor chip. An internal pad connecting an external wire and an internal wire are formed on a silicon oxide film. The internal pad is wider than the internal wire. A portion at which the internal pad and the internal wire are connected to each other is located above the semiconductor chip. The internal pad disperses stress resulting from changes in the volume of the epoxy resin caused by temperature changes. Accordingly, stress does not concentrate in the internal wire.

3 Claims, 7 Drawing Sheets

CHIP SIZE PACKAGE WITH STRESS RELIEVING INTERNAL TERMINAL

CROSS-REFERENCES TO RELATED APPLICATIONS

This application is based upon and claims the benefit of priority from prior Japanese Patent Application No. 2002-148049 filed on May 22, 2002, the entire contents of which are incorporated herein by reference.

BACKGROUND OF THE INVENTION

The present invention relates to a semiconductor integrated device and a method for manufacturing a semiconductor integrated device, and more particularly, to a semiconductor integrated device having a packaging structure and a method for manufacturing such a semiconductor integrated device.

Packaging technology is important for reducing the size of a semiconductor integrated device. FIGS. 1A and 1B show a semiconductor integrated device 1, which is a chip size package (CSP) employing packaging technology.

With reference to FIG. 1A, the semiconductor integrated device 1 includes a silicon substrate 10 and two glass substrates 20 and 30. The silicon substrate 10 has an upper surface on which integrated circuits, which are semiconductor devices, are configured. The glass substrate 20 is adhered to the upper surface of the silicon substrate 10 by epoxy resin 21. The glass substrate 30 is adhered to the lower surface of the silicon substrate 10 by epoxy resin 31. The silicon substrate 10 and the glass substrate 30 have diagonal side surfaces.

A plurality of bumps 40 are arranged as external terminals on the bottom surface of the glass substrate 30. A plurality of external wires 41 electrically connect the bumps to the integrated circuits configured on the silicon substrate 10. A protection film 42 covers the external wires 41, the epoxy resin 31, the glass substrate 30, and the portions surrounding the bumps 40.

FIG. 1B is a bottom view of the semiconductor integrated device. As shown in FIG. 1B, the bumps are arranged in a matrix-like manner on the bottom surface of the glass substrate 30 to configure a ball grid array (BGA).

FIG. 2A is a cross-sectional view showing an external wire 41 and its surroundings. As shown in FIG. 2A, a silicon oxide film ($SiO_2$) 12 is applied to the silicon substrate 10. An internal pad (internal terminal) 14 and a silicon nitride film ($Si_3N_4$) 13, which is adjacent to the internal pad 14, is formed on the silicon oxide film 12. The external wire 41 electrically connects the internal pad 14 to the bumps 40. An internal wire 15 is formed on the silicon nitride film 13 to electrically connect the internal pad 14 to the integrated circuits on the silicon substrate 10.

The internal pad 14 includes two metal layers 14a and 14b. The first metal layer 14a is formed on the silicon oxide film 12. The second metal layer 14b is formed on the first metal layer 14a. FIG. 2B is a plan view showing the periphery of the internal pad 14. The width W14 of the internal pad 14 is greater than the width W15 of the internal wire W15. Thus, the external wire 41 is connected to the internal pad 14 with a relatively low resistance.

As shown in FIG. 2A, the internal wire 15 is covered by a silicon oxide film ($SiO_2$) 16. Epoxy resin 21 adheres the silicon oxide film 16 and the glass substrate 20 together.

Temperature increase or moisture expands the materials forming the semiconductor integrated device 1 and produces stress. The degree of the stress differs in accordance with differences in the expansion coefficient of the materials.

For example, when the temperature of the semiconductor integrated device 1 changes, the volumes of the epoxy resins 21 and 31, the expansion coefficients of which are relatively large, change significantly. The stress resulting from the volume change of the epoxy resin 31 is applied to the internal pad 14 and the internal wire 15. More specifically, a temperature increase expands the epoxy resin 31 and produces stress resulting from the difference between the expansion coefficients of the epoxy resin 31 and the internal pad 14. The stress acts on the internal pad 14 outwardly along the surface of the silicon substrate 10, that is, toward the external wire 41. A temperature decrease contracts the epoxy resin 31 and produces stress acting on the internal pad 14 inwardly along the surface of the silicon substrate 10, that is, away from the external wire 41.

Stress is applied in a concentrated manner to certain sections of the internal wire 15. With reference to FIG. 3, which is a diagram illustrating an example of the stress, stress concentration will now be described. The epoxy resin 31 expands and contracts more than the silicon substrate. Thus, the internal pad 14 expands and contracts so as to follow the expansion and contraction of the epoxy resin 31. The internal pad 14 is represented by spring SP in FIG. 3. Stress resulting from the expansion and contraction of the epoxy resin 31 concentrates in the proximity of the boundary between the silicon substrate 10 and the epoxy resin 31, that is, in region B, which is encircled by the broken lines in FIG. 3. Repetitive application of stress causes fatigue of the internal wire 15. This may break the internal wire 15 and cause an abnormality of the semiconductor integrated device.

A filler may be mixed with the epoxy resin 31 to decrease the expansion coefficient. However, the expansion coefficient is still greater than that of the silicon substrate 10 even if a filler is mixed with the epoxy resin 31. Accordingly, this does not solve the problem caused by the difference between expansion coefficients.

SUMMARY OF THE INVENTION

One aspect of the present invention is a semiconductor integrated device including an insulative substrate having a first substrate surface, on which a plurality of external terminals are configured, and a second substrate surface, which is opposite to the first substrate surface. A semiconductor chip has a first chip surface, on which a plurality of semiconductor devices are configured, a second chip surface, which is opposite to the first chip surface, and a side surface, which connects the first chip surface and the second chip surface. The second chip surface is opposed to the second substrate surface. Resin covers the side surface of the semiconductor chip and is applied between the second substrate surface and the second chip surface. The resin has an outer surface covering the side surface of the semiconductor chip. A plurality of external wires are formed along the outer surface of the resin and are electrically connected to the external terminals. A plurality of internal terminals are each connected to the external wires and relatively narrow internal wires. Each internal terminal extends above and across a boundary between the resin and the side surface of the semiconductor chip.

A further aspect of the present invention is a method for manufacturing a semiconductor device. The method includes forming an internal terminal on a first surface of a semiconductor wafer from which a plurality of semiconductor chips are fabricated so as to extend across a boundary between two adjacent semiconductor chips of the plurality of semiconductor chips, and etching a second surface of the semiconductor wafer that is opposite to the first surface along the boundary to expose a surface of the internal terminal. The exposed surface includes side surfaces of the semiconductor chips. The method further includes forming a resin layer to cover the second surface and exposed surface of the semiconductor wafer, adhering an insulative substrate to the second surface of the semiconductor wafer with the resin layer, forming a plurality of external terminals on the insulative substrate, cutting at least the insulative substrate, the resin layer, and the internal terminal along the boundary, forming an external wire connecting a cross section of the exposed internal terminal to the external terminals, and cutting out a plurality of semiconductor integrated devices from the semiconductor wafer by dividing the semiconductor wafer along the boundary. The internal terminal extends above and across a boundary the side surfaces of the semiconductor chips and the resin layer.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel may be understood especially through the attached claims. The present invention, together with objects and advantages thereof, may best be understood by reference to the following description of the presently preferred embodiments together with the accompanying drawings in which:

DETAILED DESCRIPTION OF THE PREFERRED EMBODIMENTS

A semiconductor integrated device 1a according to a preferred embodiment of the present invention and a method for manufacturing the semiconductor integrated device 1a will now be discussed.

Figure 4:
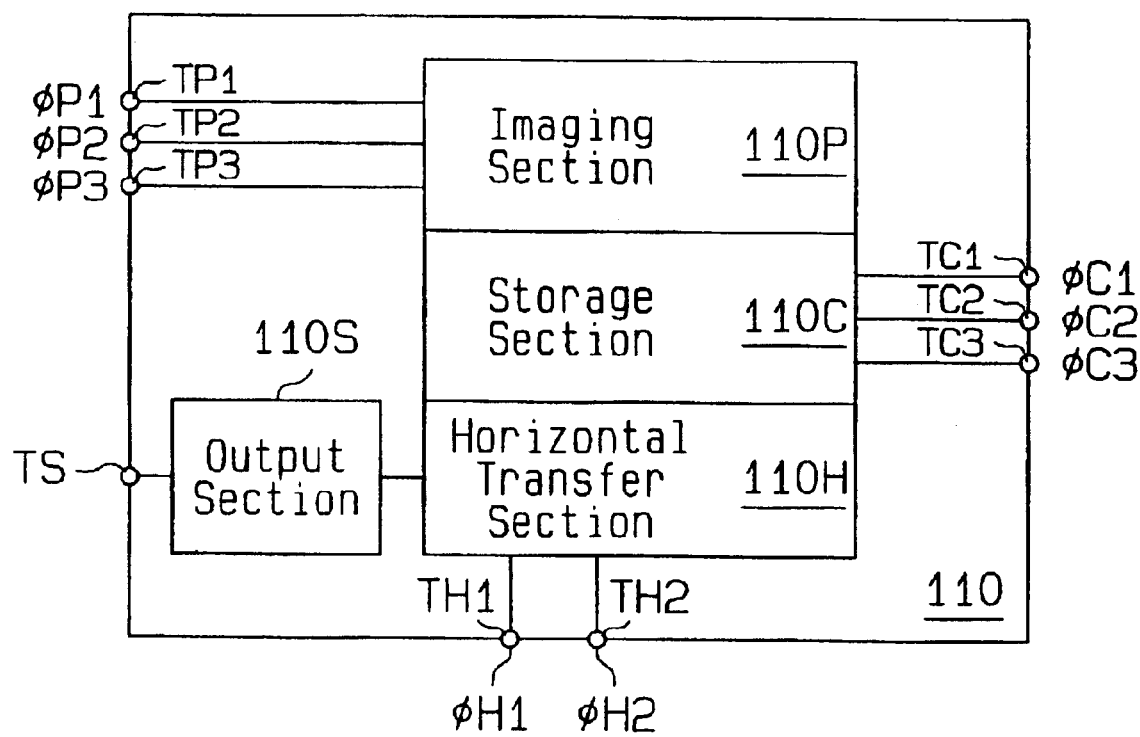
FIG. 4 is a block diagram of a semiconductor integrated device according to a preferred embodiment of the present invention.

With reference to FIG. 4, a CCD image sensor 110 is configured on the semiconductor integrated device 1a. The CCD image sensor 110 includes an imaging section 110P, which performs photoelectric conversion, a storage section 110C, which temporarily stores photoelectric-converted charges, and a horizontal transfer section 110H, which provides the charges stored in the storage section 110C to an output section 110S.

The imaging section 110P performs photoelectric conversion in accordance with a radiated light image. Information charges, which are photoelectric-converted for each pixel, are transferred (frame-shifted) to the storage section 110C for each frame. A frame of the information charges stored in the storage section 110C is transferred to the horizontal transfer section 110H one line at a time. The information charges transferred to the horizontal transfer section 110H are further transferred to the output section 110S one pixel at a time. The information charges transferred to the output section 110S are converted to voltage values and output as an image signal of the CCD image sensor 110 to a signal processor (not shown) via an output terminal TS.

Voltages are applied to the gate electrodes of each of the sections 110P, 110C, and 110H to transfer the information charges of the CCD image sensor 110. More specifically, in the imaging section 110P (and the storage section 110C), three phases of different voltages ØP1 to ØP3 (ØC1 to ØC3) are respectively applied to predetermined gate electrodes via terminals TP1 to TP3 (TC1 to TC3) to transfer charges. In the horizontal transfer section 110H, two phases of difference voltages ØH1 and ØH2 are respectively applied to predetermined gate electrodes via terminals TH1 and TH2 to transfer charges.

Figure 1A:
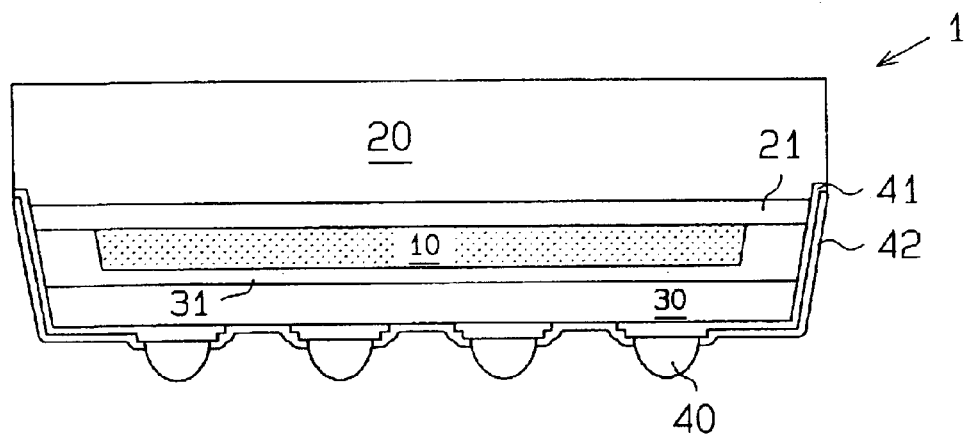
FIG. 1A is a schematic diagram of a prior art semiconductor integrated device.
Figure 1B:
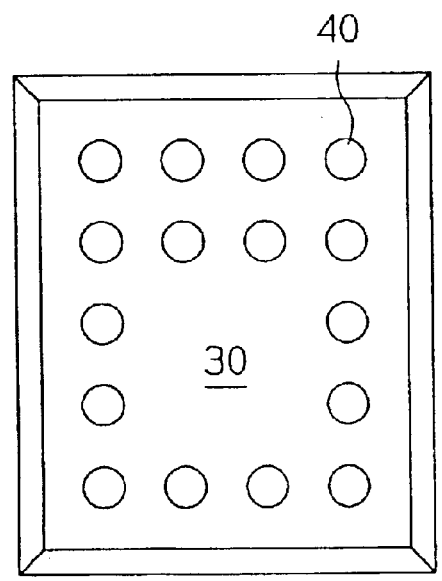
FIG. 1B is a bottom view of the semiconductor integrated device of FIG. 1A.
Figure 2A:
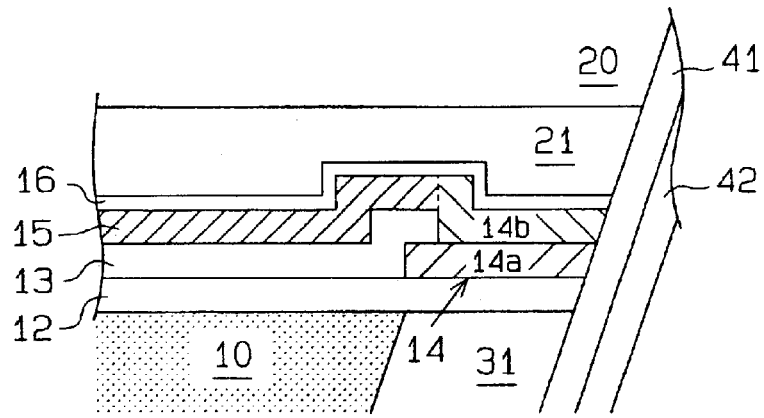
FIG. 2A is a partial cross-sectional view of the prior art semiconductor integrated device.
Figure 2B:
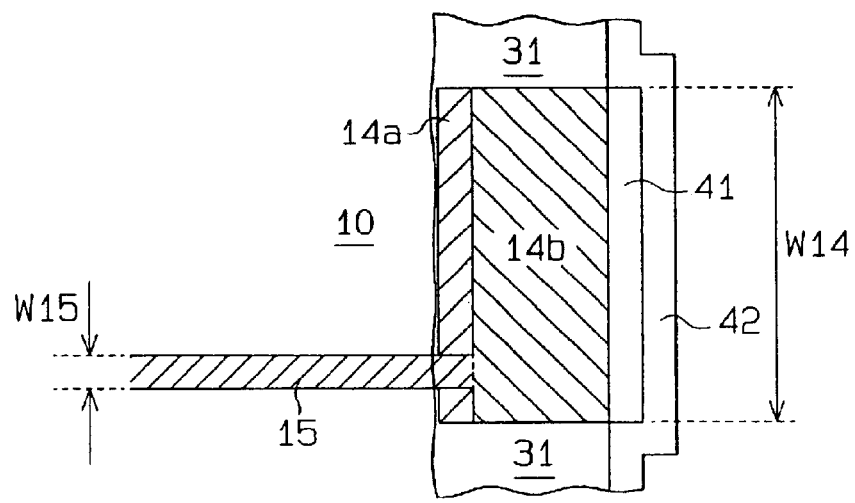
FIG. 2B is a plan view showing an internal pad of the semiconductor integrated device of FIG. 2A.
Figure 3:
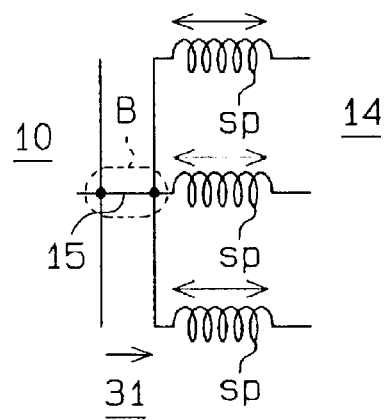
FIG. 3 is a diagram illustrating an example of stress acting on the semiconductor integrated device of FIG. 2B.

The CCD image sensor 110 is packaged in compliance with the chip size package of FIG. 1. That is, the CCD image sensor 110 is configured on an upper surface (first chip surface) of a semiconductor chip 100, such as the silicon chip of FIG. 5A. A silicon oxide film ($SiO_2$) 120 is applied to the first chip surface of the semiconductor chip 100. An internal pad 140 is formed on the silicon oxide film 120 to electrically connect an integrated circuit configured on the semiconductor chip 100, such as the CCD image sensor 110, to an external terminal via an external wire 410. A silicon nitride film ($Si_3N_4$) 130 is formed on the silicon oxide film 120 adjacent to the internal pad 140. An internal wire 150 is formed on the silicon nitride film 130 to electrically connect the internal pad 140 to the integrated circuit on the semiconductor chip 100.

The internal pad 140 includes two metal layers 140a and 140b. The first metal layer (lower layer) 140a is formed on the silicon oxide film 120, and the second metal layer (upper layer) 140b is formed on the first metal layer 140a. FIG. 5B is a plan view of the internal pad 140. As shown in FIG. 5B, the internal pad 140 is wider than the internal wire 150. That is, the width W140 of the internal pad 140 on the upper surface of the semiconductor chip 100 is greater than the width W150 of the internal wire 150 at a connection portion 145, which is connected with the second metal layer 140b. It is preferred that the internal wire and the second metal layer 140b be formed in the same process.

Figure 5A:
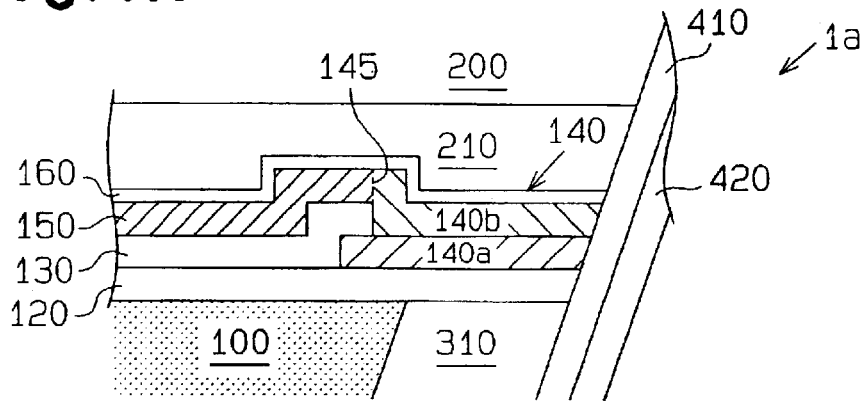
FIG. 5A is a partial cross-sectional view of the semiconductor integrated device of FIG. 4.
Figure 5B:
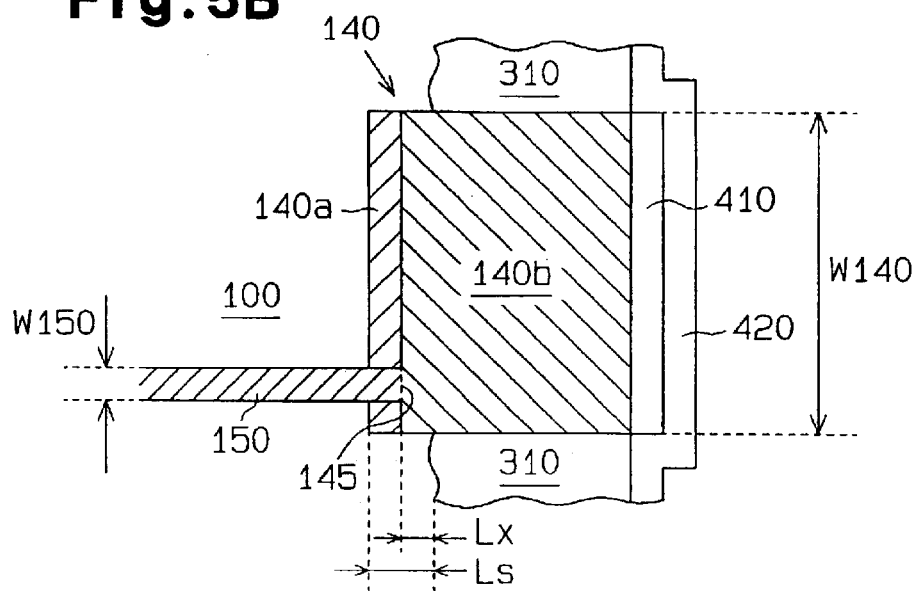
FIG. 5B is a plan view showing an internal pad of the semiconductor integrated device of FIG. 5A.

As shown in FIG. 5A, the internal pad 140 and the internal wire 150 are covered by a silicon oxide film ($SiO_2$) 160. An epoxy resin 210 adheres the silicon oxide film 160 to a transparent substrate (glass substrate) 200.

Referring to FIG. 5A, an end portion of the first metal layer 140a and the connection portion 145 between the internal pad 140 and the internal wire 150 are arranged above the semiconductor chip 100 and inward (leftward as viewed in FIG. 5A) from the boundary between the semiconductor chip 100 and the epoxy resin 310. In other words, when viewing the internal pad 140 from above, the connection portion 145 and the end portion of the first metal layer 140a is overlapped with the semiconductor chip 100. It is preferred that the overlapping length Ls of the first metal layer 140a and the semiconductor chip 100 be greater than null. It is also preferred that the overlapping length Lx of the second metal layer 140b and the semiconductor chip 100 be greater than null (refer to FIG. 8).

The change in the position of the internal pad 140 contributes to lessening expansion and contraction of the epoxy resin 310. Since the expansion coefficient of the epoxy resin 310 is greater than that of the semiconductor chip 100, when the epoxy resin 310 expands (or contracts), a large degree of stress is applied to the region above the boundary between the semiconductor chip 100 and the epoxy resin 310. In the prior art, the internal wire 150 extends over the region above that boundary. However, in the preferred embodiment, the internal pad 140 extends over the region above the boundary, and the narrow internal wire 150 is located outside the region above the boundary. Thus, the internal pad 140 functions as a buffer region for absorbing or dispersing stress.

Figure 6:
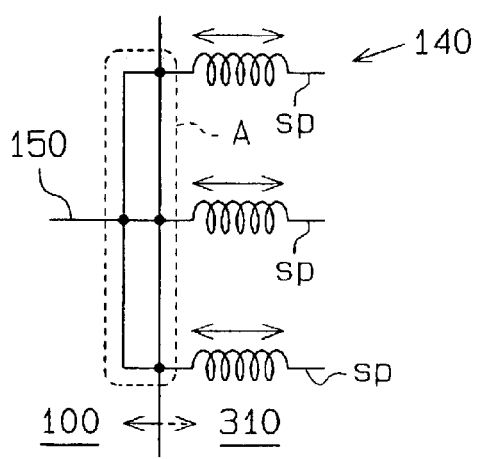
FIG. 6 is a diagram illustrating an example of stress acting on the semiconductor integrated device of FIG. 5B.

FIG. 6 is a diagram schematically illustrating how stress acts. As the volume of the epoxy resin 310 changes, part of the internal pad 140 (represented by spring SP in FIG. 6) expands or contracts. The internal pad 140 is formed above the semiconductor chip 100 in a manner extending over the boundary between the semiconductor chip 100 and the epoxy resin 310. Another part of the internal pad 140 (region A, which is encompassed by broken lines) is arranged above the semiconductor chip 100. Due to this layout, region A of the internal pad 140 functions as a buffer region and absorbs or disperses stress that is produced in the vicinity of the interface between the epoxy resin 310 and the semiconductor chip 100. Accordingly, stress is not concentrated at the narrow internal wire 150.

Figure 7:
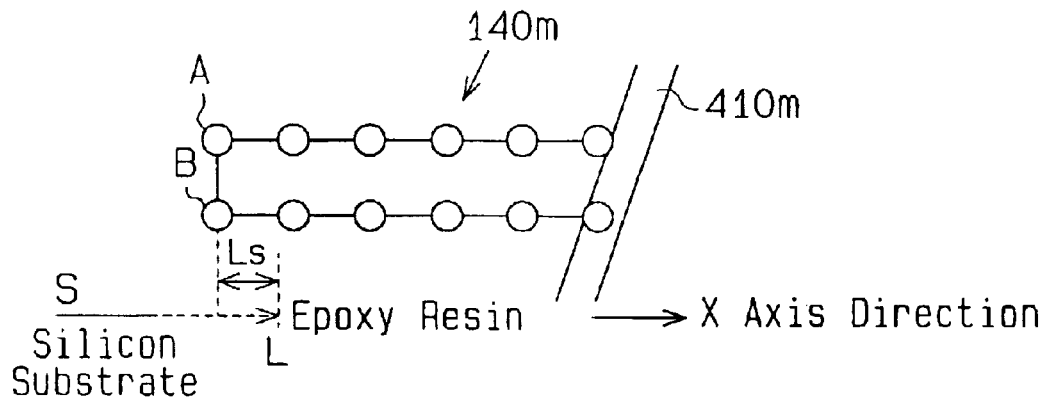
FIG. 7 is a diagram illustrating a dynamic simulation model of the internal pad.
Figure 8:
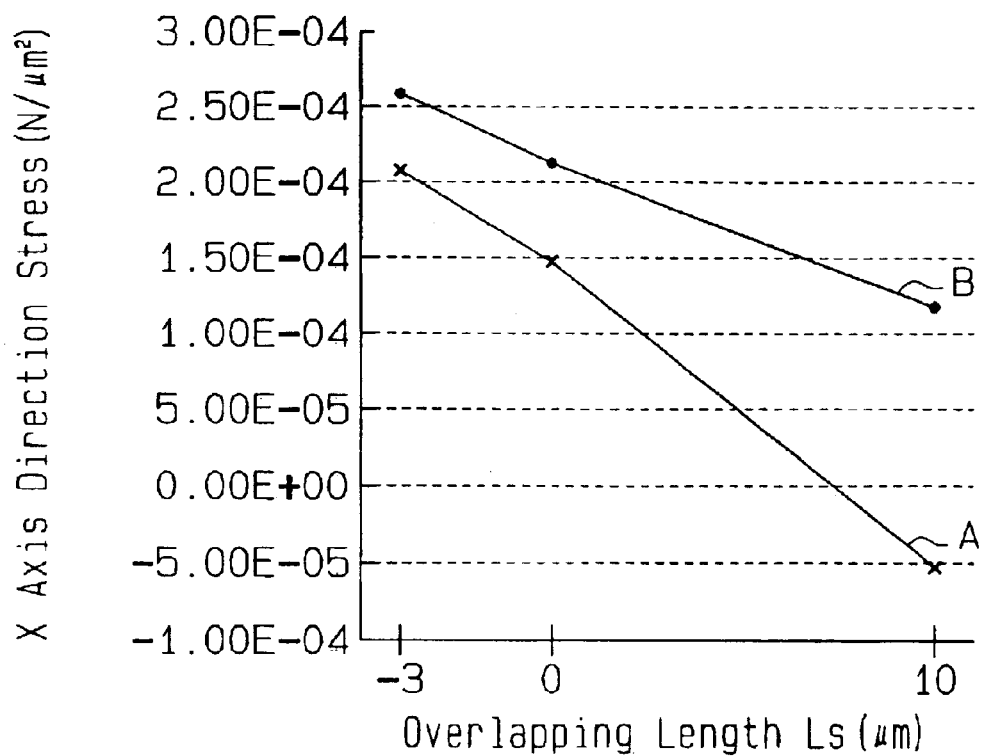
FIG. 8 is a graph illustrating the stress applied to the internal pad.

It is also apparent that the internal pad 140 functions as a buffer region from FIG. 8, which illustrates the result of a simulation. The stress applied to the internal pad 140 was simulated using a finite element model such as that shown in FIG. 7. A model 410m of the external wire 410 was connected to a model 140m of the internal pad 140 that has twelve contacts (represented by circles). The boundary L between the silicon substrate and the epoxy resin was moved in the direction indicated by arrow S to change the overlapping length Ls of the internal pad model 140m and the silicon substrate. The changes in the stress along the X axis direction acting on ends A and B of the internal pad model 140m was simulated. The simulation results are shown in FIG. 8.

In FIG. 8, when the overlapping length Ls is a negative value, this indicates that the internal pad model 140m is not overlapped with the silicon substrate and the ends A and B of the internal pad model 140m are located on the epoxy resin side of the boundary L between the silicon substrate and the epoxy resin. As shown in FIG. 8, the stress applied to the ends A and B of the internal pad model 140m decreases as the overlap length Ls increases.

An end portion of the internal pad 140 is located in the semiconductor integrated device 1a inward (i.e., the side of the semiconductor chip 100) from the boundary between the semiconductor chip 100 and the epoxy resin 310. Further, the portion of the internal pad 140 having a relatively large cross-sectional area (connection portion 145) is arranged above the semiconductor chip 100. This disperses the stress resulting from volume changes of the epoxy resin 310.

A method for manufacturing the CCD image sensor 110 will now be discussed with reference to FIG. 9A to FIG. 9H.

Figure 9A:
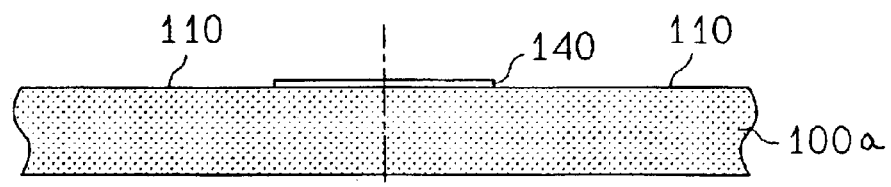
FIGS. 9A to 9H are cross-sectional views illustrating the procedures for manufacturing the semiconductor integrated device of FIG. 4.
Figure 9B:
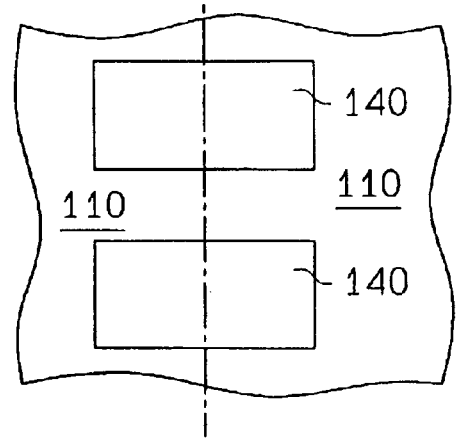

A wafer 100a, from which a plurality of semiconductor chips 100 may be cut, is prepared. A plurality of CCD image sensors 110 are configured on one side of the wafer 100a. After forming the silicon oxide film 120 (not shown), as shown in FIGS. 9A and 9B, at least one metal layer (internal pad) 140 is formed so as to extend over the boundary (broken line) between two adjacent CCD image sensors 110 on the light receiving surface on which the CCD image sensors 110 are configured. The metal layer 140, which is subsequently processed, functions as the lower layer (first metal layer) 140a of the internal pad 140 and is preferably aluminum (Al). The metal layer 140 is formed at positions corresponding to the terminals TP1 to TP3, TC1 to TC3, TH1, TH2, and TS of FIG. 4.

Figure 9C:
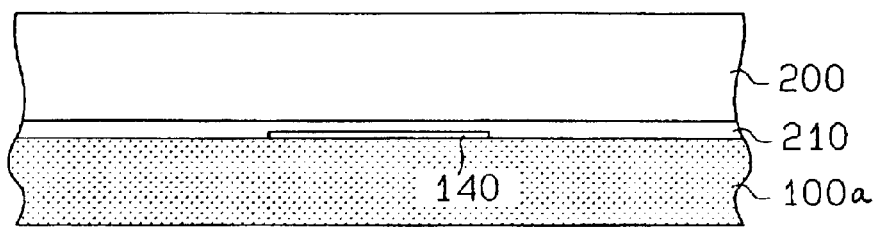
Figure 9D:
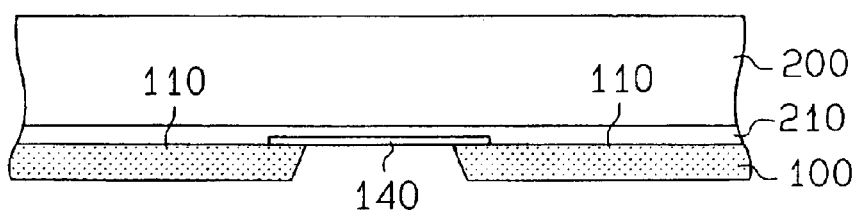

Then, the silicon nitride film 130, the second metal layer 140b, the internal wire 150, and the silicon oxide film 160 (FIG. 5) are formed. As shown in FIG. 9C, the glass substrate 200 is adhered to the light receiving surface with epoxy resin 210. Then, as shown in FIG. 9d, the lower surface of the wafer 100a (opposite to the light receiving surface) is ground until the relatively thin semiconductor chip 100 is obtained. Subsequently, the boundaries of the CCD image sensor 110 is etched to expose part of the metal layer 140 from the lower surface of the wafer 100a. Due to the etching, the opposed surfaces of two adjacent semiconductor chips 100 are inclined so that their edges becomes closer as each edge approaches the glass substrate 200.

Figure 9E:
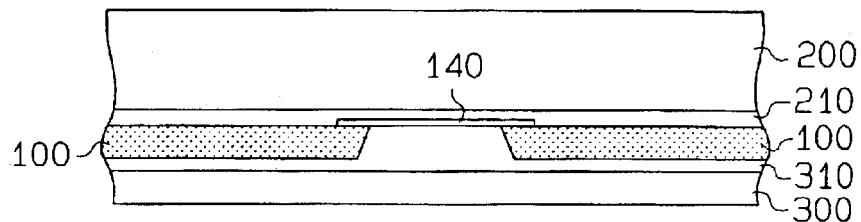

Referring to FIG. 9E, a glass substrate 300 is adhered to the lower surface of the semiconductor chip 100 with the epoxy resin 310. The epoxy resin 310 covers the lower surface and side surfaces of the semiconductor chip 100.

Figure 9F:
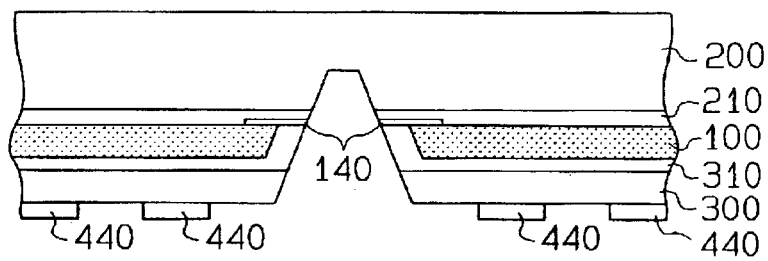

Referring to FIG. 9F, a plurality of absorbers 440 are formed on the lower surface of the glass substrate 300. Further, the metal layer 140 is cut by, for example, a diamond cutter. This forms a V-groove in the glass substrate 300, the epoxy resin 310, the internal pad 140, the epoxy resin 210, and part of the glass substrate 200. The cross-section of the internal pad 140 is exposed.

Figure 9G:
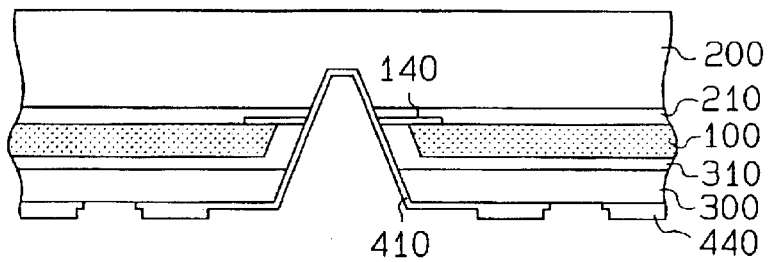

Referring to FIG. 9G, for example, sputtering is performed to deposit the metal layer 410 (e.g., aluminum Al) and cover the absorbers 440 and the groove. The metal layer 410 is patterned to form the external wire 410. The external wire 410 extends across the side of the epoxy resin 310 and connects the internal pad 140 to the absorbers 440. The external wire 410 does not contact the side surface of the semiconductor chip 100.

Figure 9H:
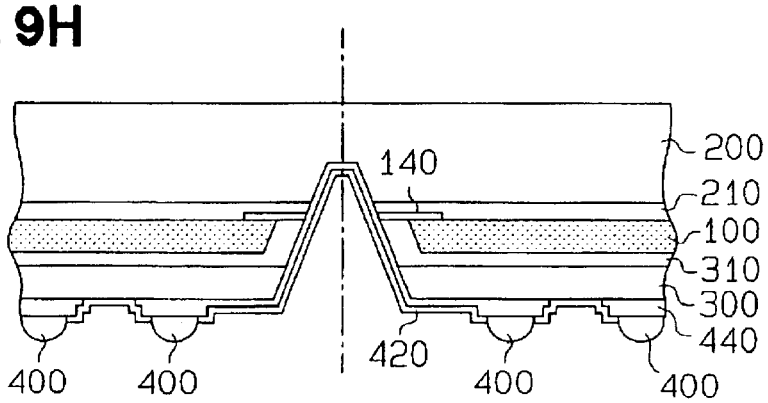

Referring to FIG. 9H, a protection film 420 is superimposed on regions excluding bumps 400, which are formed on the absorbers 440. Finally, the structure is cut along the broken line shown in FIG. 9H to obtain a plurality of semiconductor integrated devices 1a (dices). A CCD image sensor is packaged in each semiconductor integrated device 1a.

The etching width of the semiconductor chip 100 is set in the etching step so that part of the internal pad 140 (connection portion 145) is arranged inward from the side surface of the semiconductor chip 100, which contacts the epoxy resin 310. Further, to obtain the sufficient overlapping lengths Lx and Ls of the semiconductor chip 100 and the internal pad 140, it is preferred that a sufficient margin be provided for the space between two adjacent CCD image sensors and for the length of the metal layer 140.

The preferred embodiment has the advantages described below.

(1) An end portion of the internal pad 140 is located inward (the side in which the semiconductor chip is located) from the boundary between the semiconductor chip 100 and the epoxy resin 310. The internal pad 140 functions as a buffer region for dispersing or absorbing stress and prevents stress, which results from the expansion and concentration of the epoxy resin 310, from concentrating on the internal wire 150.

(2) The section in which the first metal layer 140*a* and the second metal layer 140*b* are overlapped is arranged above the semiconductor chip 100. In the internal pad 140, in which the cross-section changes in a stepped manner from the internal wire 150 toward the external wire 410, the portion having a relatively large cross-section is arranged above the semiconductor chip 100. Thus, stress resulting from the expansion and contraction of the epoxy resin 310 is efficiently dispersed.

It should be apparent to those skilled in the art that the present invention may be embodied in many other specific forms without departing from the spirit or scope of the invention. Particularly, it should be understood that the present invention may be embodied in the following forms.

In the preferred embodiment, an end portion of the internal pad 140 (first metal layer 140*a*) and the connection portion 145 between the internal wire 150 and the second metal layer 140*b* are both located inward from the boundary between the side surface of the semiconductor chip 100 and the epoxy resin 310. However, the present invention is not limited to such structure. For example, only the end portion of the first metal layer 140*a* may be located outward from the boundary between the semiconductor chip 100 and the epoxy resin 310. In such a case, the capability for absorbing stress is slightly reduced in comparison with the above preferred embodiment. However, the stress applied to the boundary between the internal wire 150 and the second metal layer 140*b* is still absorbed.

The internal pad 140 may be formed from a single layer. In this case, the first metal layer 140*a* would not be formed on the upper surface of the epoxy resin 310 only the internal wire 150 and the second metal layer 140*b* would be formed on the first metal layer 140*a*. Further, the internal wire 150 and the second metal layer 140*b* would be formed so that the connection portion 145 between the internal wire 150 and the second metal layer 140*b* are located above the semiconductor chip 100.

If the internal pad 140 includes a plurality of layers, the internal wire 150 does not have to be connected to the uppermost layer of the internal pad 140. For example, the internal wire 150 may be connected to the lower first metal layer 140*a*. In this case, the upper layer (second metal layer 140*b*) does not have to be located above the semiconductor chip 100.

If the internal wire 150 is connected to the second metal layer 140*b*, the first metal layer 140*a* does not have to be located above the semiconductor chip 100 as long as the second metal layer 140*b* is located above the semiconductor chip 100.

A substrate made of a transparent material may be used in lieu of the glass substrate 200.

A substrate made of an insulative material may be used in lieu of the glass substrate 300.

The transparent substrate 200 and the insulative substrate 300 are adhered to each other with an adhesive, such as the epoxy resins 210 and 310. However, an adhesive other than epoxy resin may be employed. If the expansion and contraction degree of the adhesive is high, that is, if the expansion coefficient of the adhesive is greater than that of the semiconductor chip 100, it is especially effective when the portion of the internal pad 140 connected to the narrow internal wire 150 is located above the semiconductor chip 100.

The overlapping lengths Lx, Ls are not limited as long as the end portion of the internal pad 140 connected to the relatively narrow internal wire 150 is located above the semiconductor chip 100.

The integrated circuit configured on the semiconductor chip does not have to be a frame transfer CCD image sensor and may be, for example, an interline CCD image sensor.

The present examples and embodiments are to be considered as illustrative and not restrictive, and the invention is not to be limited to the details given herein, but may be modified within the scope and equivalence of the appended claims.

What is claimed is:

1. A semiconductor integrated device comprising:
   an insulative substrate having a first substrate surface, on which a plurality of external terminals are configured, and a second substrate surface, which is opposite to the first substrate surface;
   a semiconductor chip having a first chip surface, on which a plurality of semiconductor devices are configured, a second chip surface, which is opposite to the first chip surface, and a side surface, which connects the first chip surface and the second chip surface, wherein the second chip surface is opposed to the second substrate surface;
   resin covering the side surface of the semiconductor chip and applied between the second substrate surface and the second chip surface, wherein the resin has an outer surface covering the side surface of the semiconductor chip;
   a plurality of external wires formed along the outer surface of the resin and electrically connected to the external terminals; and
   a plurality of internal terminals connected to the external wires and relatively narrow internal wires, wherein each internal terminal extends above and across a boundary between the resin and the side surface of the semiconductor chip.

2. The semiconductor integrated device according to claim 1, wherein each of the internal terminals has a plurality of layers including at least one layer that is opposed to the resin, wherein each of the internal wires is connected to one of the plurality of layers, and wherein, the at least one layer extends above and across the boundary between the resin and the side surface of the semiconductor chip.

3. The semiconductor integrated device according to claim 2, wherein a region in which the plurality of layers overlap one another extends above and across the boundary.

* * * * *